United States Patent
Robbins (10) Patent No.: US 9,008,978 B2
(45) Date of Patent: Apr. 14, 2015

(54) SYSTEM AND METHOD FOR ARC DETECTION IN SOLAR POWER ARRAYS

(75) Inventor: Steven Andrew Robbins, Calabasas, CA (US)

(73) Assignee: Sunfield Semiconductor, Inc., Calabasas, CA (US)

( * ) Notice: Subject to any disclaimer, the term of this patent is extended or adjusted under 35 U.S.C. 154(b) by 483 days.

(21) Appl. No.: 13/272,582

(22) Filed: Oct. 13, 2011

(65) Prior Publication Data

US 2012/0318320 A1    Dec. 20, 2012

Related U.S. Application Data

(60) Provisional application No. 61/498,174, filed on Jun. 17, 2011.

(51) Int. Cl.

| | |
|---|---|
| *G06F 19/00* | (2011.01) |
| *G01R 31/26* | (2014.01) |
| *H01L 31/042* | (2014.01) |
| *H01L 31/02* | (2006.01) |
| *G01R 31/12* | (2006.01) |
| *H02H 1/00* | (2006.01) |
| *H02H 7/20* | (2006.01) |
| *H02S 50/10* | (2014.01) |

(52) U.S. Cl.
CPC ...... *H01L 31/02021* (2013.01); *G01R 31/1227* (2013.01); *H02H 1/0015* (2013.01); *H02H 7/20* (2013.01); *Y02E 10/50* (2013.01); *H02S 50/10* (2014.12)

(58) Field of Classification Search
USPC ............ 136/244, 256, 246, 251, 259; 361/42; 702/183, 58; 324/539
See application file for complete search history.

(56) References Cited

U.S. PATENT DOCUMENTS

| | | | |
|---|---|---|---|
| 6,175,780 B1 * | 1/2001 | Engel | 700/293 |
| 2006/0271313 A1 * | 11/2006 | Mollenkopf | 702/62 |
| 2010/0043319 A1 * | 2/2010 | Bennett | 52/173.3 |
| 2010/0167644 A1 * | 7/2010 | Winter et al. | 455/41.1 |
| 2011/0037600 A1 * | 2/2011 | Takehara et al. | 340/635 |
| 2011/0090607 A1 * | 4/2011 | Luebke et al. | 361/42 |
| 2011/0141644 A1 * | 6/2011 | Hastings et al. | 361/93.2 |

* cited by examiner

*Primary Examiner* — Eliseo Ramos Feliciano
*Assistant Examiner* — Seokjin Kim
(74) *Attorney, Agent, or Firm* — Lowry Blixseth LLP; Scott M. Lowry (57) ABSTRACT

A system and method for detecting arc faults in photovoltaic solar power arrays. A plurality of short range communications links between the modules in the array are utilized as a distributed arc detection system. The communication links between adjacent pairs of modules in the array form a network with a matrix topology. The links are implemented with modulated magnetic fields. By monitoring the level of noise in each communication link, the signature of an arc fault is detected, and the general location of the arc can often be determined.

23 Claims, 7 Drawing Sheets

SYSTEM AND METHOD FOR ARC DETECTION IN SOLAR POWER ARRAYS

RELATED APPLICATIONS

This application claims priority from U.S. provisional utility patent application No. 61/498,174 filed on 17 Jun. 2011.

BACKGROUND

The invention relates generally to the field of solar power, and more specifically to methods of detecting arc faults in photovoltaic solar power arrays.

The solar power industry is facing a growing safety concern over arc faults. The reason relates to the way in which conventional photovoltaic solar power arrays are constructed, producing high voltage dc in a circuit with a large number of series connections. For example, a typical photovoltaic cell produces about 0.5Vdc in full sunlight, and a typical solar power module includes seventy two cells. Therefore, an array of sixteen such modules wired in series would produce about 576Vdc, and the system would have 1152 series connections (not counting additional connections in the junction boxes, combiner boxes, cable connectors, inverter, etc.). If any one of these connections opens, then the entire output voltage of the solar array is concentrated across the small gap, resulting in an arc that can reach temperatures of several thousand degrees, and the arc is often difficult to extinguish.

The industry has been building conventional arrays like this for a long time, and there are now a large number that have been in the field for twenty years or more. These systems are beginning to show signs of age, and the annual number of reported fires is starting to rise. This is why the 2011 National Electrical Code (NEC) now requires an Arc Fault Circuit Interrupter (AFCI) in solar arrays that produce more than 60Vdc.

Figure 1:
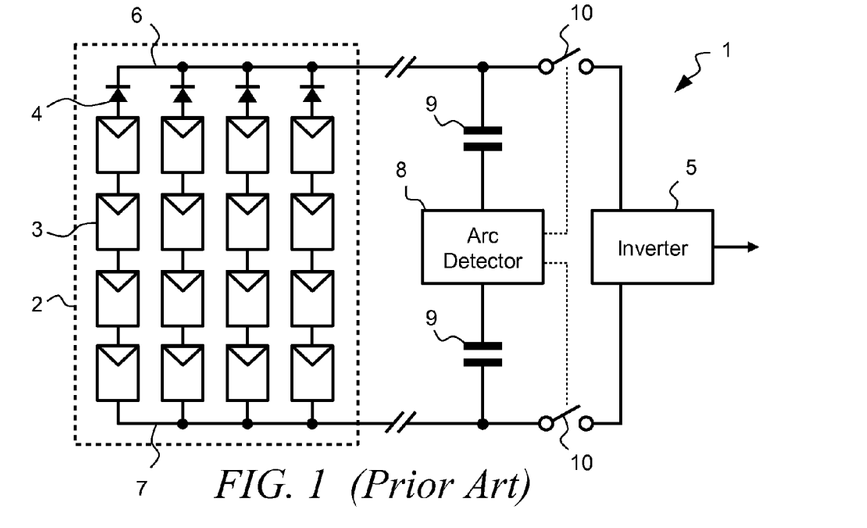
FIG. 1 is an example of a prior art photovoltaic solar power system utilizing conventional arc detection methods.

Various companies are working on developing AFCI products for solar power arrays. FIG. 1 shows a typical example of a solar power system 1 that utilizes conventional AFCI. An array 2 of conventional solar power modules 3 and blocking diodes 4 is connected to an inverter 5 via a power bus with positive 6 and negative 7 rails. A conventional arc detector 8 is coupled to the power rails via capacitors 9. When an arc is detected, the arc detector 8 opens the power switches 10, thereby interrupting the current, and thus extinguishing the arc.

Figure 2:
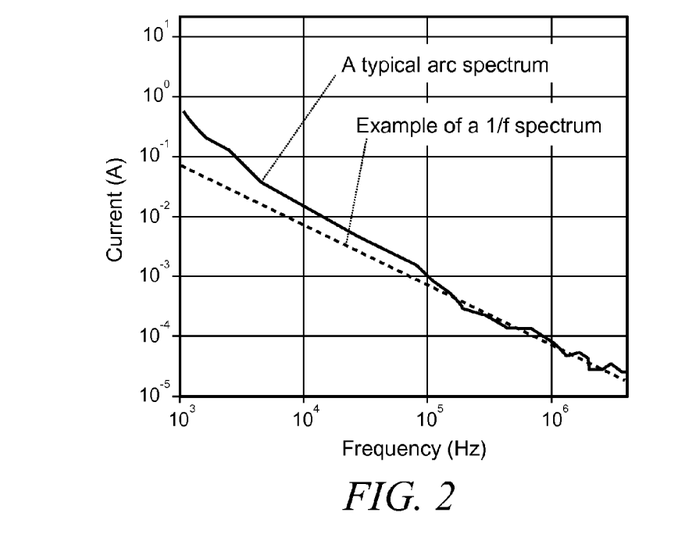
FIG. 2 is a graph depicting a typical spectrum generated by an arc.

The conventional arc detector 8 looks for the spectral signature generated by the arc. FIG. 2 shows a typical example of such a signature, where the current amplitude is approximately inversely related to the frequency; a relationship that is commonly referred to as a 1/f spectrum. Since both axis of the graph in FIG. 2 are logarithmic, a 1/f spectrum appears as a straight line with a downward slope as shown.

The conventional solar power system 1, and the like, face several technical challenges. First, a large solar array can act as a large antenna, picking up noise from the environment and creating the potential for false alarms. Second, the array 2 can act as a filter that distorts the arc signature, or makes environmental noise look like an arc signature. And third, the arc detector 8 can detect the presence of the arc, but cannot locate it; so it may be difficult to get the system 1 up again after a shutdown.

The problem of not being able to locate the arc is significant. If the system 1 works properly, it shuts down before any significant damage occurs, so there may be little visible evidence of the arc. In fact, arcs can occur inside the junction box on the back side of a solar module, where they cannot be seen without disassembly of the module. What is more, a typical solar power array can cover a large area. Searching for a small burn pattern in a large array can be like looking for the proverbial needle in a haystack. An operator may be forced to power up the system repeatedly until enough damage accumulates to make the fault location apparent. And what is worse, if the arc cannot be found, then maintenance personnel may mistakenly assume the shutdown was a false alarm. This is worrisome because some people may actually try to circumvent the AFCI system if the "false" alarms persist.

Accordingly, there is a strong need in the field of photovoltaic solar power for a method of reliably detecting an arc fault, and determining its general location. The present invention fulfills these needs and provides other related benefits.

SUMMARY

A plurality of solar power modules are arranged into an array. Modulated magnetic fields are used to establish a plurality of communication links between adjacent solar power modules. Data representing the level of noise in the communication links is acquired and analyzed to detect the arc fault signature. When the arc signature is detected, a signal is sent, indicating the solar power array must be put into a safe state. Some embodiments of the method also include steps of assigning row and column coordinates to each solar power module, and when the arc fault is detected, processing the acquired data to determine its location. The noise data is acquired by estimating bit error rates and/or by measuring the noise floor. The signature of an arc is detected by comparing the magnitude of noise versus frequency and/or by estimating the magnitude of a noise gradient. Additionally, preferred embodiments of the method include adding capacitors to the chain of solar cells in order to facilitate locating the arc fault.

The solar power system includes a plurality of solar power modules arranged into a solar power array. Each solar power module includes a transceiver coupled to at least one magnetic loop used to communicate via a modulated magnetic field, a digital processor, and a power supply. Each solar power module acquires data representing the level of noise in each of the communication links with adjacent modules, and analyzes the acquired data to detect the signature of an arc fault. When a solar power module detects the signature of an arc fault, it signals that the solar power array must be put into a safe state where the arc is extinguished. Each solar power module also comprises a plurality of photovoltaic cells connected in series to form a chain, and in preferred embodiments, at least one capacitor is connected in parallel with a segment of photovoltaic cells to form a loop for producing a localized magnetic field in response to an arc within the loop.

BRIEF DESCRIPTION OF THE DRAWINGS

The accompanying drawings illustrate the invention. In such drawings.

DETAILED DESCRIPTION

Figure 3A:
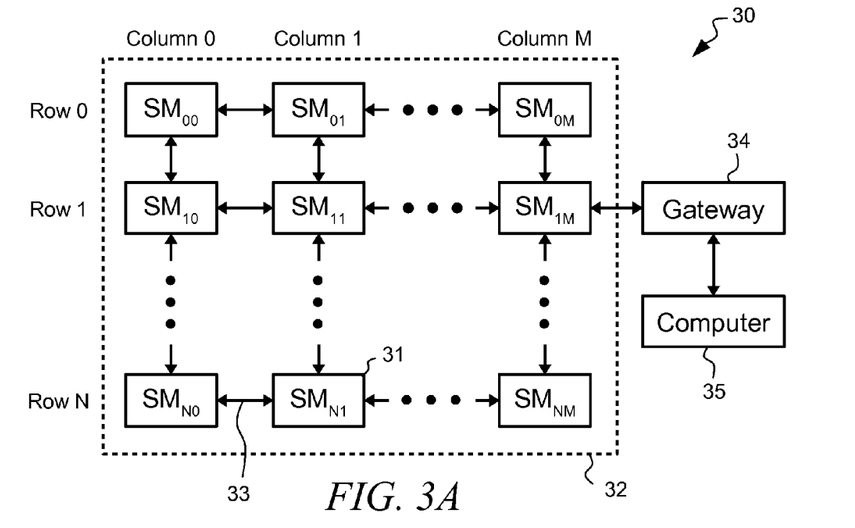
FIG. 3A is a high level block diagram of the a solar power system utilizing the arc detection method disclosed herein.
Figure 3B:
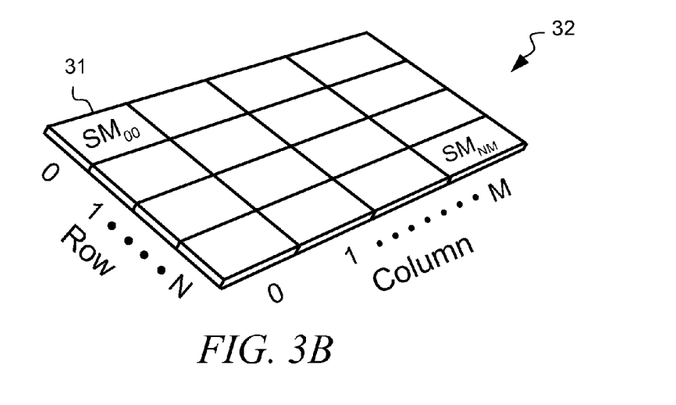
FIG. 3B shows the layout of a typical solar power array, showing the relationship between the physical layout and the communications network.

FIG. 3A shows a high level block diagram of a solar power system 30 utilizing the arc detection method disclosed herein. A plurality of solar modules 31 ($SM_{00}$-$SM_{NM}$) are arranged into an array 32 of N rows by M columns To keep FIG. 3A simple, the inverter and power cables are not shown. The solar modules 31 communicate with each other via a plurality of short range peer-to-peer communication links 33. Each solar module 31 communicates with adjacent modules in the array. Thus, the communications network has a matrix topology, with a structure directly corresponding to the spatial arrangement of the solar modules 31 in the array 32, as shown in FIG. 3B.

In preferred embodiments, at least one module 31 in the array 32 is linked to a computer 35 via a gateway device 34. The primary function of the gateway device 34 is to provide electrical isolation between the solar array 32 and the computer 35 because the solar power modules 31 will typically be at voltage potentials much higher than the computer 35.

In the context of this document, the term "adjacent" hereinafter refers to the spatial relationship between two solar power modules 31; two modules are considered to be adjacent if they share the same row or column in the solar power array 32, and with no other solar power module 31 between them.

The communication links 33 are implemented with modulated magnetic fields emitted and received by magnetic loops. A magnetic loop is simply a loop of conductor with one or more turns, but it is different from a loop antenna. A loop antenna produces radio waves because it has a circumference roughly equal to the carrier wavelength, allowing the formation of standing waves. In contrast, a magnetic loop is far smaller than the carrier wavelength, and, therefore, its impedance is predominantly inductive, with a very small radiation resistance. For example, a 500 kHz signal has a wavelength of about 600 m, while each magnetic loop in the system 30 may have a circumference of roughly 2 m or less. So, while a magnetic loop can produce electromagnetic waves in the far field (with low efficiency), over short distances, of one wavelength or less, it can only produce and detect magnetic fields.

Figure 4:
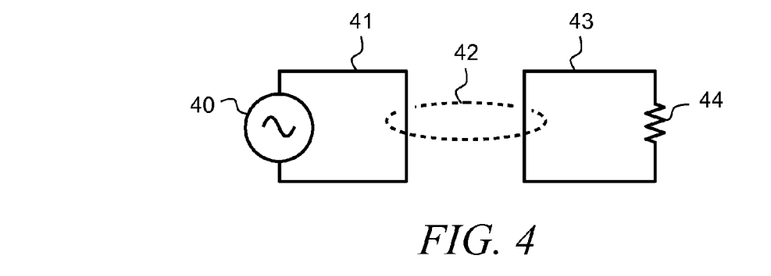
FIG. 4 is a circuit diagram illustrating magnetic loop communication.

To further describe the principle of communication via magnetic fields, FIG. 4 shows an ideal circuit where a signal source 40 produces an ac current flow in a first magnetic loop 41, thus creating an ac magnetic field. Some of the magnetic flux lines 42 couple to a second magnetic loop 43, inducing an ac current which the resistor 44 converts to an output voltage. Thus, the two circuits are essentially transformer-coupled. The two magnetic loops form the windings of an air-core transformer with very low coupling coefficient. This type of communication is very different from radio communication. For example, magnetic fields cannot propagate like radio waves.

Figure 5:
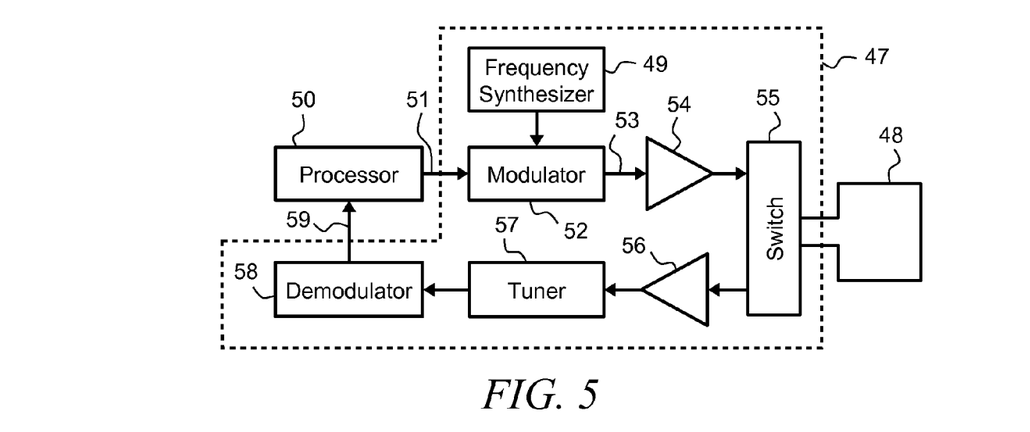
FIG. 5 is a high level block diagram of an exemplary embodiment of the transceiver for use with an arc detecting solar array.

Each solar power module 31 includes at least one transceiver circuit coupled to at least one magnetic loop. The transceiver is similar in architecture to a radio transceiver, so a person of ordinary skill in the art will readily recognize that there may be many different variations. One exemplary embodiment of the transceiver 47 is shown in FIG. 5 as a high level block diagram. This particular exemplary embodiment is half-duplex. A frequency synthesizer 49 generates the carrier frequency. A digital processor 50 sends a serial data stream 51 to a modulator 52 which modulates the carrier signal. The modulated signal 53 then goes through a first amplifier 54. During transmission of data, a switch 55 couples the first amplifier 54 to the magnetic loop 48. When the transceiver is receiving data, the switch 55 couples the magnetic loop 48 to a second amplifier 56. The amplified signal then goes through a tuner 57 to select the frequency channel, and then through a demodulator 58, and finally the demodulated signal 59 goes to the digital processor 50. In some embodiments, the switch 55 is omitted and two magnetic loops are utilized where: a first magnetic loop coupled to the first amplifier 54 is used to transmit data; and a second magnetic loop coupled to the second amplifier 56 is used to receive data.

Figure 6:
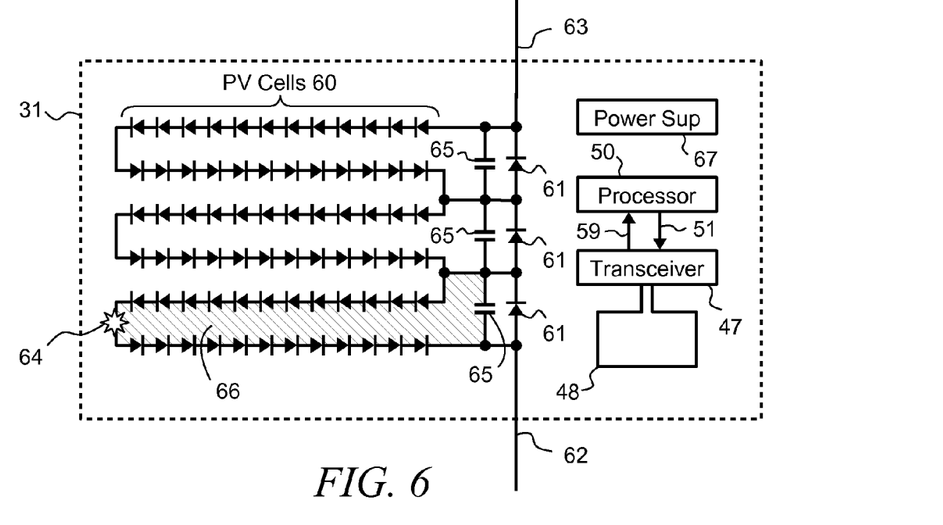
FIG. 6 shows a solar power module including capacitors that enhance the systems ability to locate arcs.

FIG. 6 shows a solar power module 31 that includes a chain of photovoltaic cells 60 arranged on the panel in a serpentine pattern, and bypass rectifiers 61 connected in parallel with segments of the chain. When the module 31 is unshaded, dc current flows into it via a negative wire 62, through the cells 60, and then out via a positive wire 63. If an arc fault 64 occurs, the dc current flow is modulated by the arc to create an ac noise current with an approximately 1/f spectrum. In a conventional solar power module, this ac noise current would flow through the entire solar array via the wires 62 and 63, which makes determining the arc location difficult. But in FIG. 6 capacitors 65 are added, which essentially act as short circuits over the frequency range the transceiver 47 is sensitive to. So the ac noise current generated by the arc 64 is essentially confined to a magnetic loop formed by the capacitor 65 and the segment of PV cells connected in parallel the capacitor; this magnetic loop emits an amplitude-modulated magnetic field with approximately 1/f spectrum, and the flux lines 42 radiate out from the area 66 enclosed by the loop. The transceiver 47 detects some of the flux lines via its associated magnetic loop 48, and the digital processor 50 analyzes the data to detect the arc signature. The solar module 31 also includes a power supply circuit 67 that receives power from the PV cells 60 and provides power to the processor 50 and transceiver 47.

The capacitors 65 have other beneficial effects. For example, by confining the ac noise current to a particular area, the capacitors prevent the noise current from traveling to other parts of the array, so there are no significant signals far away from the arc that could confuse the system's attempts to determine the location. Additionally, the capacitors help the system to overcome one of the disadvantages of conventional, centralized arc detection methods; since the arc noise current does not travel through the cabling of the array, the filtering effects of the cabling are avoided, and thus the distortion of the 1/f spectral signature of the arc due to filtering is avoided.

Figure 7:
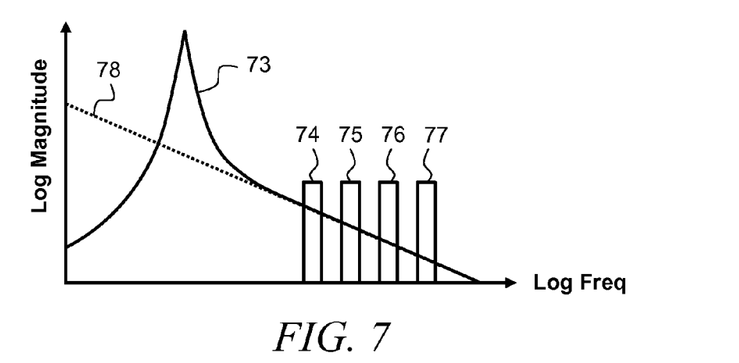
FIG. 7 illustrates the how noise in a communication link varies with the channel frequency.

In some embodiments the transceiver circuits 47 utilize a plurality of discrete frequency channels. These channels are typically distributed over a range from about 100 kHz to 800 kHz. FIG. 7 shows an example including four frequency channels 74, 75, 76, and 77. An example of an idealized arc spectrum 78 is also shown. When an arc 64 occurs, it generates a magnetic field with a spectrum approximately as shown by 73. The resonant peak is the result of the capacitor 65 in parallel with the self-inductance of the segment of photovoltaic cells 60. The capacitor 65 is typically chosen with a large enough capacitance to assure the resonant peak is well below the lowest frequency channel 74 to avoid distortion of the 1/f arc signature. FIG. 7 is not drawn to any particular scale; it merely illustrates two concepts that are utilized by the system and method disclosed herein: first, the communication links 33 are deliberately designed to be sensitive to noise generated by a nearby arc fault; and second, the level of interference has a roughly linear relationship with frequency on a log/log graph, so the lowest frequency channel 74 is most affected while the highest frequency channel 77 is affected the least.

Figure 8:
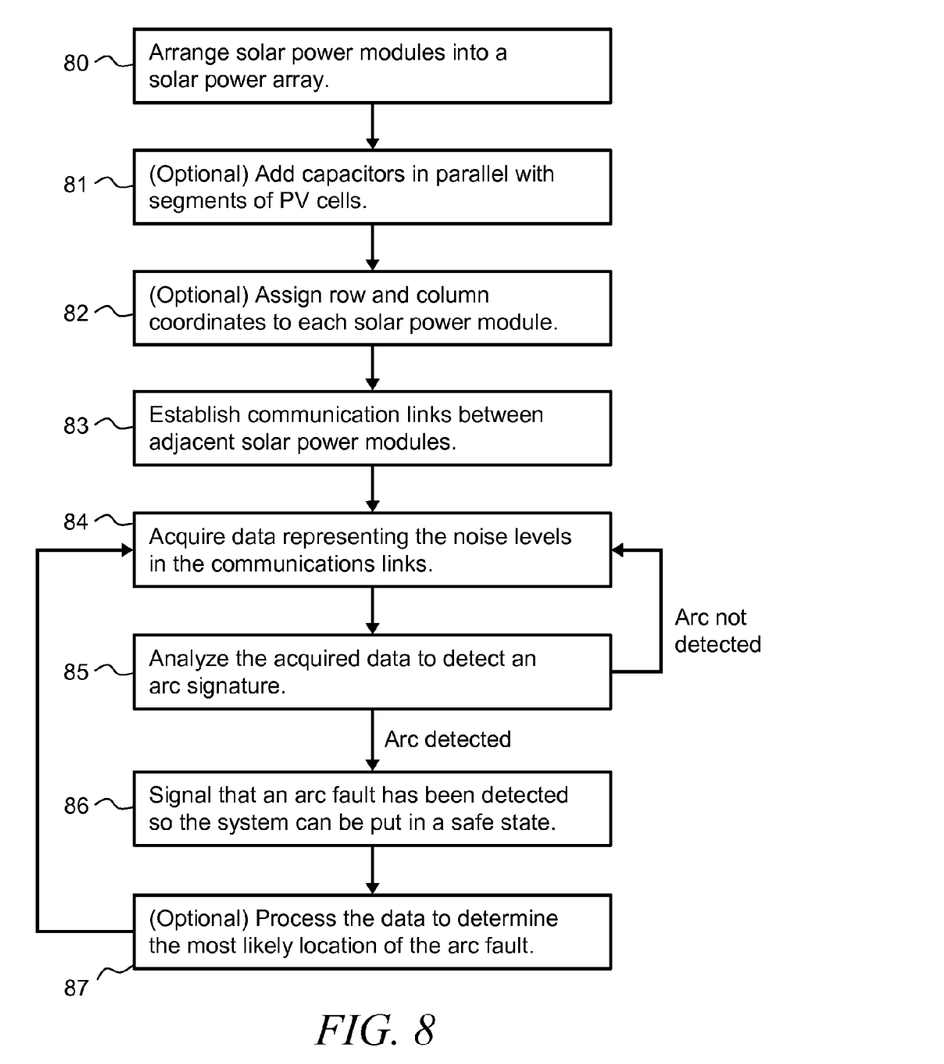
FIG. 8 is a high level flow chart of a preferred embodiment of the method disclosed herein.

Now, with the underlying principles explained, the method of detecting arc faults in a photovoltaic solar array is summarized. FIG. 8 shows a high level flow diagram of the method. In step 80, a plurality of solar power modules are arranged to form an array as shown in FIGS. 3A-3B. The modules 31 are typically arranged into linear rows and columns. The modules 31 can be oriented so that they are coplanar, as shown in FIG. 3B, or they can be tilted to face the sun more directly.

Preferred embodiments of the method include step 81 where the capacitors 65 are added to the solar power modules 31 to localize the magnetic field produced by an arc fault, as described previously.

Some embodiments of the method include step 82, wherein the row and column coordinates of each solar power module are assigned. Referring to FIG. 3A, each module 31 has unique row and column coordinates within the array 32. Each module 31 utilizes its coordinates as a unique network address, enabling the computer 35 to associate noise data with physical location. Step 82 is typically performed once when the system 30 is installed, and each module 31 stores its coordinates in non-volatile memory. One way to assign the coordinates is simply to have the installer personnel enter them manually. Alternatively, the modules 31 may employ a communication protocol that enables the array 32 to self-organize, wherein each module 31 assigns its own coordinates based on its spatial relationship to neighboring modules.

The order in which steps 80, 81, and 82 are performed is not important; for example, step 81—where the capacitors 65 are added—would typically be done before installing the solar power modules 31 in step 80. Additionally, step 82 could be performed concurrently with step 80 if the row and column coordinates are being manually assigned by the installation personnel. The order in which steps 80, 81, and 82 are shown in FIG. 8 is an arbitrary example.

In step 83, a plurality of communication links 33 are established between adjacent solar power modules 31, creating a communication network with a matrix topology as shown in FIG. 3A. For example, $SM_{11}$ establishes four links with adjacent modules: two in the same row ($SM_{10}$ and $SM_{12}$); and two in the same column ($SM_{01}$ and $SM_{21}$). The communication links 33 are wireless—utilizing modulated magnetic fields to convey information as described above—so the connections of power cables (not shown in FIG. 3A for simplicity) are irrelevant. In fact, the communication network is able to operate with all power cables disconnected.

In step 84 data related to the level of noise in the communication links 33 is acquired. In a first embodiment of step 84, the communication links 33 include a means of detecting bit errors, such as parity bits or error correction codes, and the noise level is estimated by counting bit errors to estimate the average bit error rate detected in each communication link 33.

The noise generated by an arc fault interferes with the communication links 33, causing bit errors; the higher the noise level, the greater the rate of bit errors.

Figure 9:
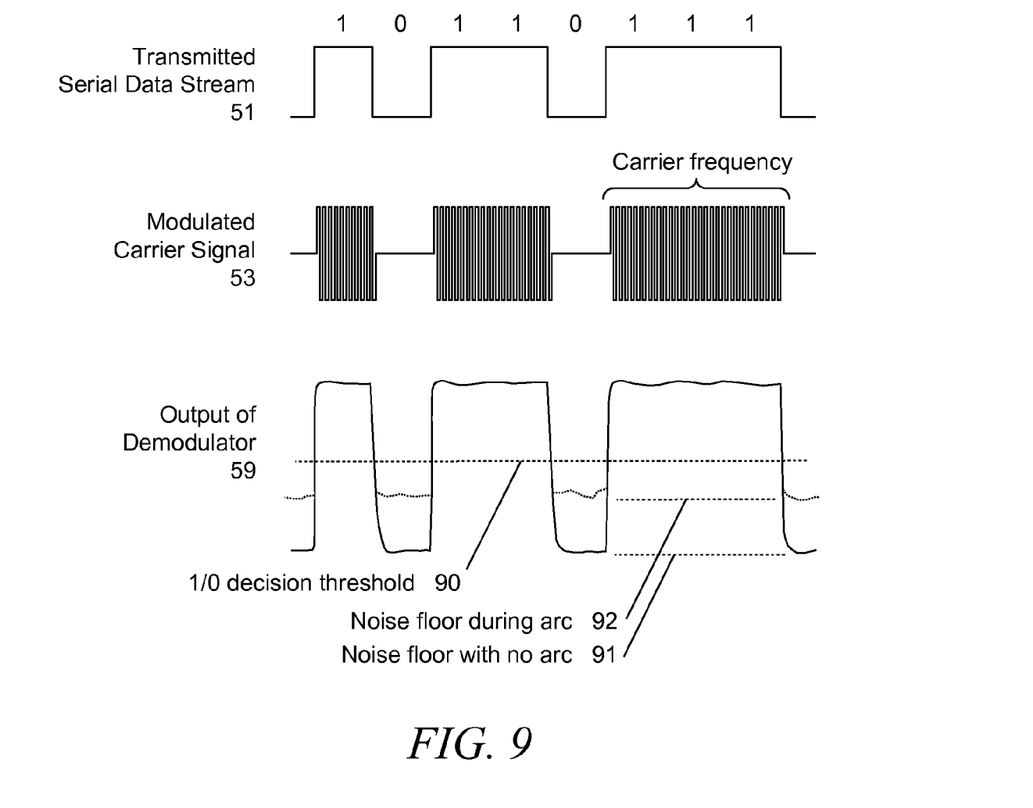
FIG. 9 shows example waveforms, illustrating how noise data is acquired in some embodiments.

A second exemplary embodiment of step 84 is illustrated by the signal waveforms in FIG. 9. These waveforms show one communication link 33, where a first solar power module transmits data, and a second solar power module receives the data. The top signal 51 shows a Non-Return to Zero (NRZ) binary data stream "10110111" generated by the digital processing unit 50 in the first solar power module. The middle waveform 53 shows the data stream after modulation using Amplitude Shift Keying (ASK) where each '1' is represented by a burst of the carrier frequency, and each '0' is represented by the absence of the carrier. The bottom waveform 59 shows the received signal, output by the demodulator 58 in the second solar power module. In this embodiment, each digital processor 50 includes an Analog-to-Digital Converter (ADC) that samples the demodulated signal 59. When the demodulated signal 59 is above a predetermined threshold 90 then it is considered to be a binary '1'. And when the signal 59 is below the threshold 90 then it is considered to be a binary '0'. During periods where the signal 59 is below the threshold 90, the readings acquired by the ADC in the second solar power module represent the level of noise in the communication link 33 between the first and second solar power modules. When there is no arc, the noise is at a first level 91. During an arc fault, the noise increases to a second level 92. Coding may be used to assure that intervals between '0' bits are short, so that an arc signature cannot go unnoticed for too long. For example, Manchester coding would guarantee a maximum of two bit periods between '0' bits.

The first and second embodiments of step 84 are not mutually exclusive; a third embodiment of step 84 comprises the first and second embodiments.

Figure 10A:
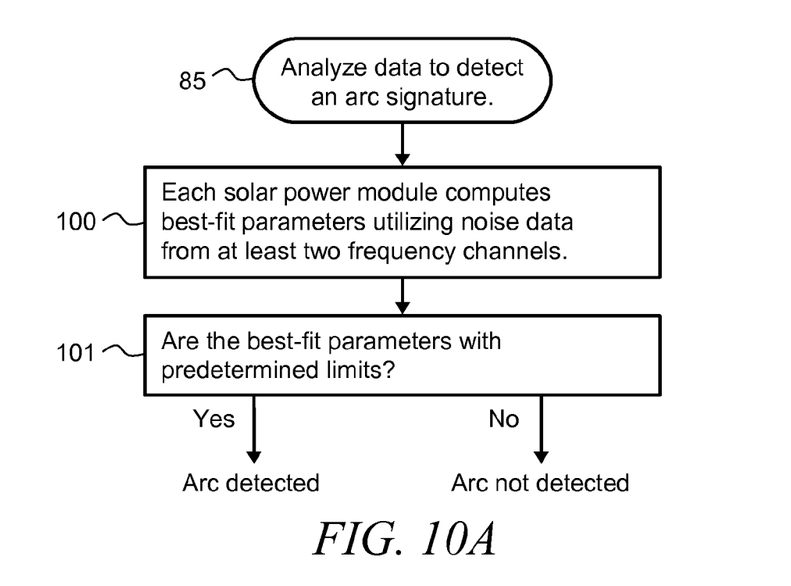
FIG. 10A shows a high level flow chart disclosing some embodiments wherein the signature of an arc is detected by analyzing noise relative to frequency.

In step 85, the acquired noise data is analyzed to detect the arc signature. FIG. 10A shows a first embodiment of step 85, wherein the transceiver circuits 47 utilize a plurality of discrete frequency channels and noise is analyzed versus frequency. The expected arc signature has a 1/f spectrum, which appears as a straight line 78 on a log/log graph, as shown in FIG. 7. In step 100, each solar power module 31 utilizes noise data from at least two frequency channels to compute at least one best-fit parameter for a line through the data on a log/log plot. Typically, one parameter is the slope of the best-fit line. For example, in the simple case where only two frequency channels are utilized:

$$\text{slope} = [\log(N_1) - \log(N_2)] / [\log(f_1) - \log(f_2)]$$

where $N_1$ is a first noise level measured at the first frequency $f_1$, and $N_2$ is a second noise level measured at the second frequency $f_2$. If more than two frequency channels are utilized, then the slope can be calculated by the well-known least squares method. For example, a solar power module 31 somewhere in the middle of the array 32 would have communication links 33 with each of its four neighbors as shown in FIG. 3A. If the four links utilize different frequency channels, then the solar module 31 would have four data points of noise versus frequency, because the noise level in each link 33 is measured in step 84. Another parameter that can be computed is a correlation coefficient, which indicates how well the data fits a straight line.

In step 101, each solar power module 31 determines if the parameters calculated in step 100 fit the expected 1/f spectrum of an arc within predefined limits that are chosen for the best trade-off between false alarm rate and reliable detection of arc faults. A 1/f spectrum has a log slope of −20 dB/decade, so the predefined limits for the best-fit slope would bracket this value, for example −25 dB/decade and −15 dB/decade. If a correlation coefficient parameter is also computed then a minimum acceptable value, 0.5 for example, would be used to determine that the data is sufficiently linear. In some embodiments the arc signature is detected in response to at least one of the computed parameters satisfying the limits; in other embodiments, each computed parameter must satisfy the associated limits for the arc signature to be detected.

Figure 10B:
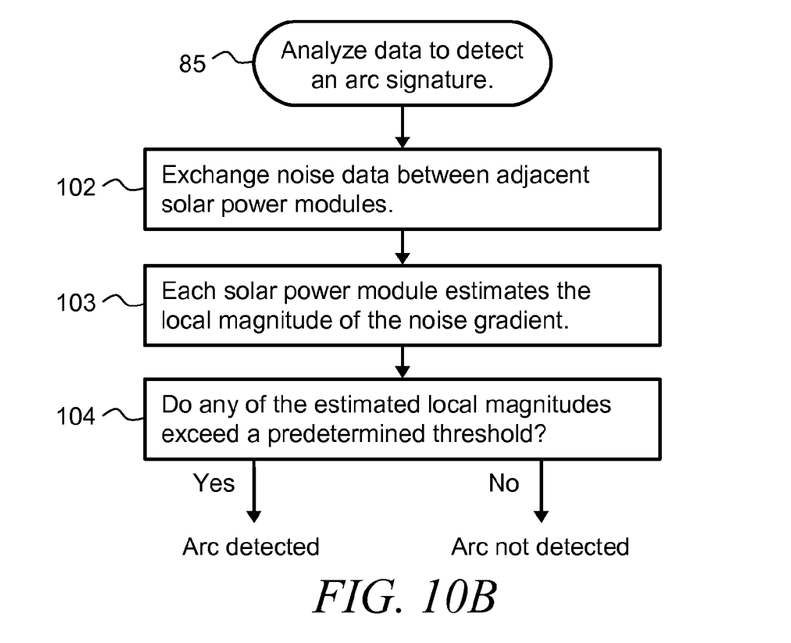
FIG. 10B shows a high level flow chart disclosing additional embodiments wherein the signature of an arc is detected by analyzing noise gradient.

FIG. 10B shows a second embodiment of step 85, wherein the acquired noise data is analyzed versus module 31 location. This second embodiment of step 85 requires that the solar power modules 31 include the capacitors 65, so step 81 must also be included. If an arc occurs, solar power modules 31 closest to the arc will see the highest noise levels, while those farther away will see lower noise levels according to the well-known inverse square law. In contrast, noise from an outside source (such as an AM radio broadcast) will cause approximately equal noise levels across the entire array 32. So the second embodiment of step 85 looks at the noise gradient to distinguish local noise sources, such as an arc fault, from distant noise sources. The noise can thought of as a scalar field that defines a curved surface function over the plane of the array 32, where the height of the surface at any point represents the noise level at the corresponding point in the plane of the area. According to basic calculus, the gradient of a scalar field is a vector field, wherein the gradient at any point is a vector pointing in the direction where the scalar increases most rapidly, and the magnitude of the vector equals the slope of the scalar along that direction. The second embodiment of step 85 estimates the local magnitude of the gradient at each solar power module 31. In step 102, adjacent solar power modules exchange the noise data that they acquired in step 84. After the exchange, each solar power module 31 has at least three noise data points. For example, referring again to FIG. 3A, in step 102, $SM_{00}$ exchanges noise data with its two neighbors, $SM_{10}$ and $SM_{01}$. $SM_{00}$ also has its own noise data, so that makes three noise data points, which form a triangle approximating a local region on the noise surface function. A module 31 in the middle of the array 32 would have five data points; its own, and data from four neighbors. In step 103, each solar power module utilizes its set of noise data points to estimate the local noise gradient magnitude. One simple way calculate the estimate is to take the span of the data, for example, $SM_{11}$ sorts the noise level data it received from $SM_{01}$, $SM_{21}$, $SM_{10}$, and $SM_{12}$, and then subtracts the lowest level from the highest level. In step 104, if the estimated gradient magnitude is greater than a predetermined threshold, then an arc is detected. Random variations in background noise levels will produce small gradients in the noise surface function, even when no arc fault is present; so the threshold must be set high enough to avoid false alarms due to background noise.

The first and second embodiments of step 85 are not mutually exclusive; a third embodiment of step 85 comprises the first and second embodiments.

If no arc signature is detected in step 85, the method returns to step 84. But when an arc is detected, step 86 sends out a signal indicating the system 30 must be placed in a safe state to terminate, or quench the arc fault. The signal is typically a special control character that is readily distinguished from that data that normally flows in the communication links. For example, the communication links 33 may include "8B/10B" encoding that is often used in computer networks; this type of encoding includes control characters that cannot be confused with the encoded data. When a solar power module 31 detects an arc, it sends the control character to its neighbors via the communication links 33. Upon receiving this control character, each neighboring solar power module 31 does the same. So the control character rapidly spreads to all solar power modules 31 in the array 32. In some embodiments, the control character is picked up by the external computer 35 via the gateway 34, and the computer 35 then opens a switch, similar to the switch 10 in FIG. 1. In other embodiments, each solar power module 31 includes a means of reducing its own output voltage to approximately zero volts. As each successive module 31 receives the control character, it reduces its own output voltage. In a short time, all modules 31 have approximately zero output, leaving the entire array 32 in a safe state. Once the arc fault is located and repaired, another special control character is distributed through the array 32 to restart the system 30.

Some embodiments of the method include step 87, wherein the computer 35 determines the most likely location of the arc fault by processing noise data from a plurality of the modules 31 in the array 32. The analysis requires that the row and column coordinates of each module be assigned, so embodiments of the method that include step 87, must also included step 82. In step 87, each module 31 reports its coordinates and the noise level in each of its communication links 33 to the computer 35. The computer 35 organizes all the data into a map showing noise level as a function of row and column. If the arc fault occurred in a module 31 that includes capacitors 65, then the map will show a cluster of high noise readings around the module 31 where the arc occurred.

In summary, the system and method disclosed herein for arc fault detection in solar power arrays has many strong advantages over prior art. First, the general location of the arc can be determined, which is impossible with conventional AFCI systems. Second, false alarms are reduced because the small magnetic loops provide excellent immunity to outside interference. Third, detection of arc faults is more reliable than conventional AFCI because of the distributed nature of the system; an arc anywhere in the array will be within a short distance of at least one magnetic loop, and the spectral signature of the arc is not distorted by the parasitic filtering affects of the cables. Fourth, the system is inherently self-testing because the communication links utilized to detect arcs carry data continuously. As long as all modules are reporting their status, we know that arc detection is working everywhere in the array. And fifth, the communications network can be used for other purposes such as monitoring the performance of the solar power modules.

Although several embodiments have been described in detail for purposes of illustration, various modifications may be made to each without departing from the scope and spirit of the invention. Accordingly, the invention is not to be limited, except as by the appended claims.

What is claimed is:

1. A method for detecting an arc fault in a solar power array, comprising steps of:
    arranging a plurality of solar power modules into a solar power array;
    establishing a plurality of wireless communication links between adjacent solar power modules in the solar power array, wherein each wireless communication link conveys information via a modulated magnetic field;
    acquiring data representing a noise level in each wireless communication link;
    analyzing the acquired noise data to detect an arc fault signature; and
    signaling when the arc fault signature is detected.

2. The method of claim 1, wherein the wireless communication links include a means of detecting bit errors, and the acquiring step comprises counting bit errors to estimate the average bit error rate.

3. The method of claim 1, wherein each wireless communication link comprises a carrier signal modulated by Amplitude Shift Keying (ASK), wherein a bit of binary information is represented by either the presence or absence of the carrier signal during a corresponding bit period, and the acquiring step comprises quantifying the received signal strength during periods when the carrier signal is absent.

4. The method of claim 1, wherein the wireless communication links comprise a plurality of discrete frequency channels.

5. The method of claim 4, wherein the analyzing step comprises steps of:
computing best-fit parameters for noise versus frequency utilizing noise data acquired in at least two of the discrete frequency channels; and
determining that an arc signature is present in response to one or more of the computed best-fit parameters being within predetermined limits.

6. The method of claim 1, including the step of: adding a plurality of capacitors to the solar power array, each capacitor connected in parallel with one or more photovoltaic cells in the solar power modules.

7. The method of claim 6, wherein the analyzing step comprises steps of:
exchanging the acquired noise data between adjacent solar power modules;
estimating a local noise gradient magnitude for each solar power module; and
determining that an arc fault signature is detected in response to the estimated gradient magnitude for any solar power module exceeding a predetermined threshold.

8. The method of claim 6, including the step of: assigning row and column coordinates to each solar power module within the solar power array.

9. The method of claim 8, including the step of: processing the acquired noise data from a plurality of solar power modules in the solar power array to determine the most likely location of the detected arc fault.

10. A solar power system, comprising:
a plurality of solar power modules arranged in a solar power array, each solar power module comprising:
at least one segment for converting light into electricity each segment comprising a plurality of photovoltaic cells connected in series,
a transceiver circuit coupled to at least one magnetic loop for wirelessly communicating via a modulated magnetic field and detecting the time-varying magnetic field produced by an arc fault,
a digital processing unit for supplying data to the transceiver circuit, and processing signals received by the transceiver circuit, and
a power supply circuit receiving power from at least one of the photovoltaic cells and supplying power to the transceiver circuit and digital processing unit; and
a communication network comprising a plurality of wireless communication links, each wireless communication link conveying information between the digital processing units of two adjacent solar power modules via the transceiver circuits and magnetic loops.

11. The solar power system of claim 10, wherein each solar power module:
acquires data representing a level of noise in each wireless communication link that the solar power module utilizes to communicate with adjacent solar power modules;
analyzes the acquired noise data to detect a signature of an arc fault; and
signals via the communication network in response to detecting the arc signature.

12. The solar power system of claim 11, wherein each wireless communication link comprises a means of detecting bit errors, and the data representing a level of noise in each wireless communication link is acquired by counting bit errors to estimate the average bit error rate.

13. The solar power system of claim 11, wherein: each wireless communication link comprises a carrier signal that is modulated by Amplitude Shift Keying (ASK), wherein each bit of binary information is represented by either the presence or absence of the carrier signal during a corresponding bit period; and the data representing a level of noise in each wireless communication link is acquired by measuring the received signal strength during periods when the carrier signal is absent.

14. The solar power system of claim 11, wherein the transceiver circuits communicate on a plurality of discrete frequency channels.

15. The solar power system of claim 14, wherein each solar power module: computes best-fit parameters for noise versus frequency utilizing data acquired in at least two of the discrete frequency channels; and determines that an arc signature is detected in response to at least one of the computed parameters being within predetermined limits.

16. The solar power system of claim 11, wherein each solar power module comprises one or more capacitors, each capacitor connected in parallel with a segment of photovoltaic cells, forming a loop for producing a time-varying magnetic field in response to an arc fault within the loop.

17. The solar power system of claim 16, wherein each solar power module: exchanges the acquired noise data with adjacent solar power modules; estimates a local noise gradient magnitude; and determines that an arc fault signature is detected in response to the estimated gradient magnitude exceeding a predetermined threshold.

18. The solar power system of claim 16, wherein, in response to detecting the signature of an arc fault, the acquired noise data from all solar power modules in the solar power array are processed to determine the most likely location of the arc fault.

19. The solar power system of claim 10, wherein the transceiver circuit comprises a transmitter circuit and a receiver circuit.

20. The solar power system of claim 10, and further comprising: a computer for providing a user interface; and a gateway device linking at least one of the solar power modules to the computer.

21. A solar power module, comprising:
at least one segment for converting light into electricity, each segment comprising a plurality of photovoltaic cells connected in series;
one or more capacitors, each being connected in parallel with a segment of photovoltaic cells to form a loop for producing a time-varying magnetic field in response to an arc fault within the loop;
a transceiver circuit coupled to at least one magnetic loop for wirelessly communicating via a modulated magnetic field and detecting the time-varying magnetic field produced by an arc;

a digital processing unit for supplying data to the transceiver circuit, and processing signals received by the transceiver circuit; and a power supply circuit receiving power from at least one of the photovoltaic cells and supplying power to the transceiver circuit and digital processing unit.

22. The solar power module of claim 21, wherein the transceiver circuit utilizes a plurality of frequency channels.

23. The solar power module of claim 21, wherein the transceiver circuit comprises a transmitter circuit and a receiver circuit.

\* \* \* \* \*